(12) United States Patent
Ahn et al.

(10) Patent No.: US 10,962,876 B2
(45) Date of Patent: Mar. 30, 2021

(54) EUV PELLICLE STRUCTURE AND METHOD FOR MANUFACTURING SAME

(71) Applicant: IUCF-HYU (INDUSTRY-UNIVERSITY COOPERATION FOUNDATION HANYANG UNIVERSITY), Seoul (KR)

(72) Inventors: Jin Ho Ahn, Seoul (KR); Jung Hwan Kim, Seoul (KR); Jung Sik Kim, Seongnam-si (KR); Dong Gon Woo, Seoul (KR); Yong Ju Jang, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 105 days.

(21) Appl. No.: 16/046,355

(22) Filed: Jul. 26, 2018

(65) Prior Publication Data
US 2018/0348626 A1      Dec. 6, 2018

Related U.S. Application Data

(63) Continuation of application No. PCT/KR2017/000263, filed on Jan. 9, 2017.

(30) Foreign Application Priority Data

Jan. 26, 2016  (KR) .................. 10-2016-0009285

(51) Int. Cl.
G03F 1/62       (2012.01)
G03F 1/22       (2012.01)
(Continued)

(52) U.S. Cl.
CPC .............. *G03F 1/62* (2013.01); *G03F 1/22* (2013.01); *G03F 1/64* (2013.01); *G03F 7/70875* (2013.01); *G03F 7/70983* (2013.01)

(58) Field of Classification Search
CPC .......... G03F 1/62; G03F 1/64; G03F 7/70875
See application file for complete search history.

(56) References Cited

U.S. PATENT DOCUMENTS

| 6,623,893 B1 | 9/2003 | Levinson et al. |
| 7,767,985 B2 | 8/2010 | Okoroanyanwu et al. |

(Continued)

FOREIGN PATENT DOCUMENTS

| JP | 02-302757 A | 12/1990 |
| JP | 2002-107914 A | 4/2002 |

(Continued)

OTHER PUBLICATIONS

International Search Report for PCT/KR2017/000263, dated Apr. 19, 2017.
(Continued)

*Primary Examiner* — Daborah Chacko-Davis
(74) *Attorney, Agent, or Firm* — Sughrue Mion, PLLC

(57) ABSTRACT

A method for manufacturing an extreme ultraviolet (EUV) pellicle structure may include preparing a pellicle membrane that includes an intermediate layer structure in which EUV transmission layers and heat dissipation layers are alternately stacked, a first thin layer disposed on a top surface of the intermediate layer structure, and a second thin layer disposed on a bottom surface of the intermediate layer structure and having a heat emissivity lower than that of the first thin layer, and disposing a cooling structure for absorbing heat from the pellicle membrane on an edge sidewall of the pellicle membrane at which the heat dissipation layers are exposed.

12 Claims, 9 Drawing Sheets

(51) Int. Cl.
G03F 7/20 (2006.01)
G03F 1/64 (2012.01)

(56) References Cited

U.S. PATENT DOCUMENTS

| | | | |
|---|---|---|---|
| 10,001,701 B1 * | 6/2018 | Hsu | ............................ G03F 1/62 |
| 2005/0045262 A1 | 3/2005 | Eschbach et al. | |
| 2005/0048376 A1 | 3/2005 | Eschbach et al. | |
| 2006/0146313 A1 | 7/2006 | Gallagher et al. | |
| 2014/0370423 A1 | 12/2014 | Goldfarb | |
| 2018/0329314 A1 * | 11/2018 | Kruizinga | ................. G03F 1/22 |

FOREIGN PATENT DOCUMENTS

| | | | | |
|---|---|---|---|---|
| KR | 10-2009-0115657 A | | 11/2009 | |
| KR | 10-2010-0138822 A | | 12/2010 | |
| KR | 10-2012-0128654 A | | 11/2012 | |
| KR | 10-2013-0132383 A | | 12/2013 | |
| KR | 10-1552940 B1 | | 9/2015 | |
| KR | 10-2015-0145256 A | | 12/2015 | |
| WO | WO2016/001351 | * | 1/2016 | ............... G03F 7/20 |

OTHER PUBLICATIONS

Korea Intellectual Property Office, Correspondence issued Mar. 30, 2020 in Korean Application No. 10-2016-0009285.

* cited by examiner

【Fig. 1】
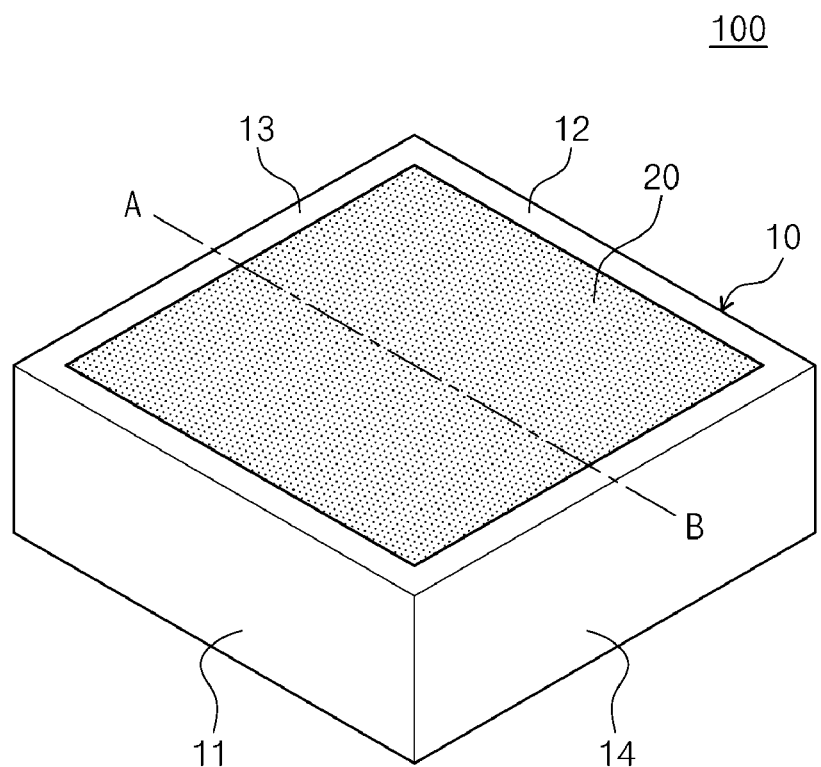
【Fig. 2】
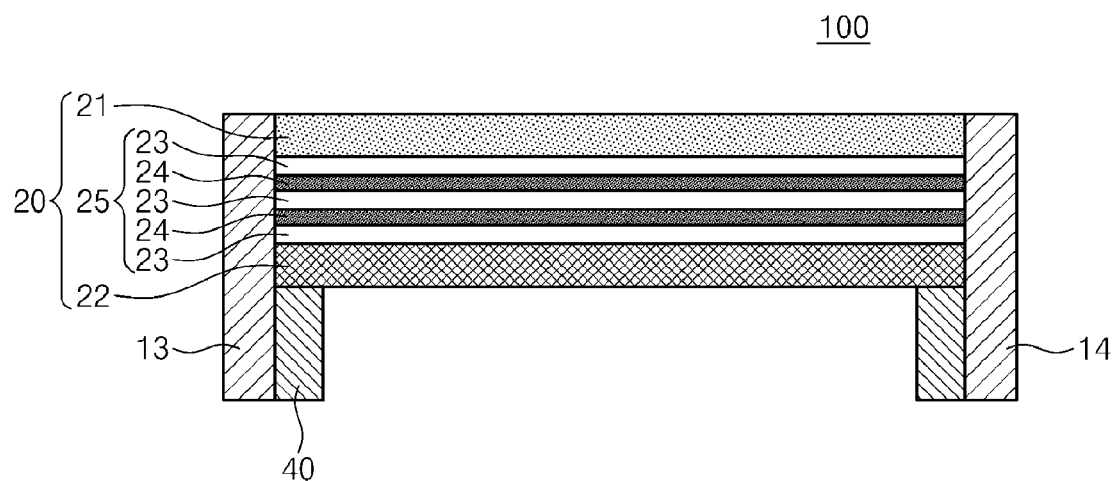

[Fig. 3]
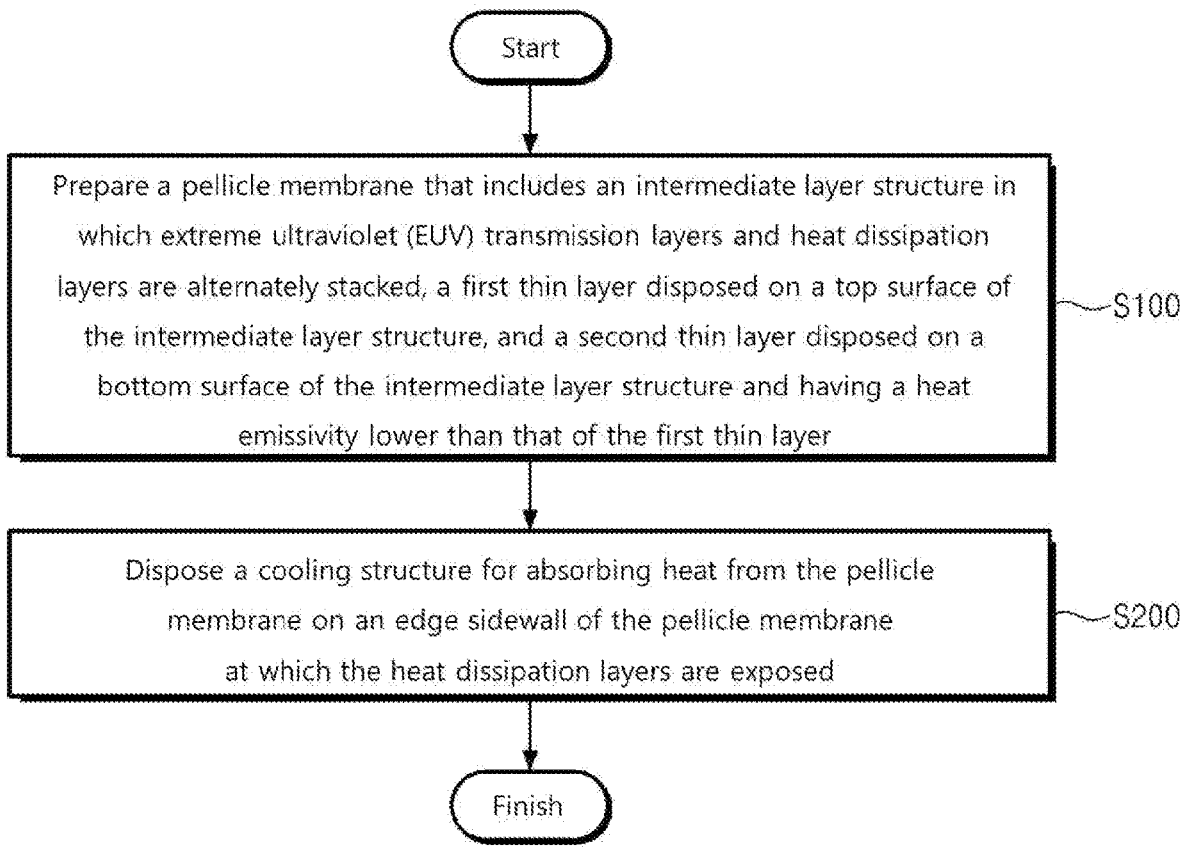

[Fig. 4]
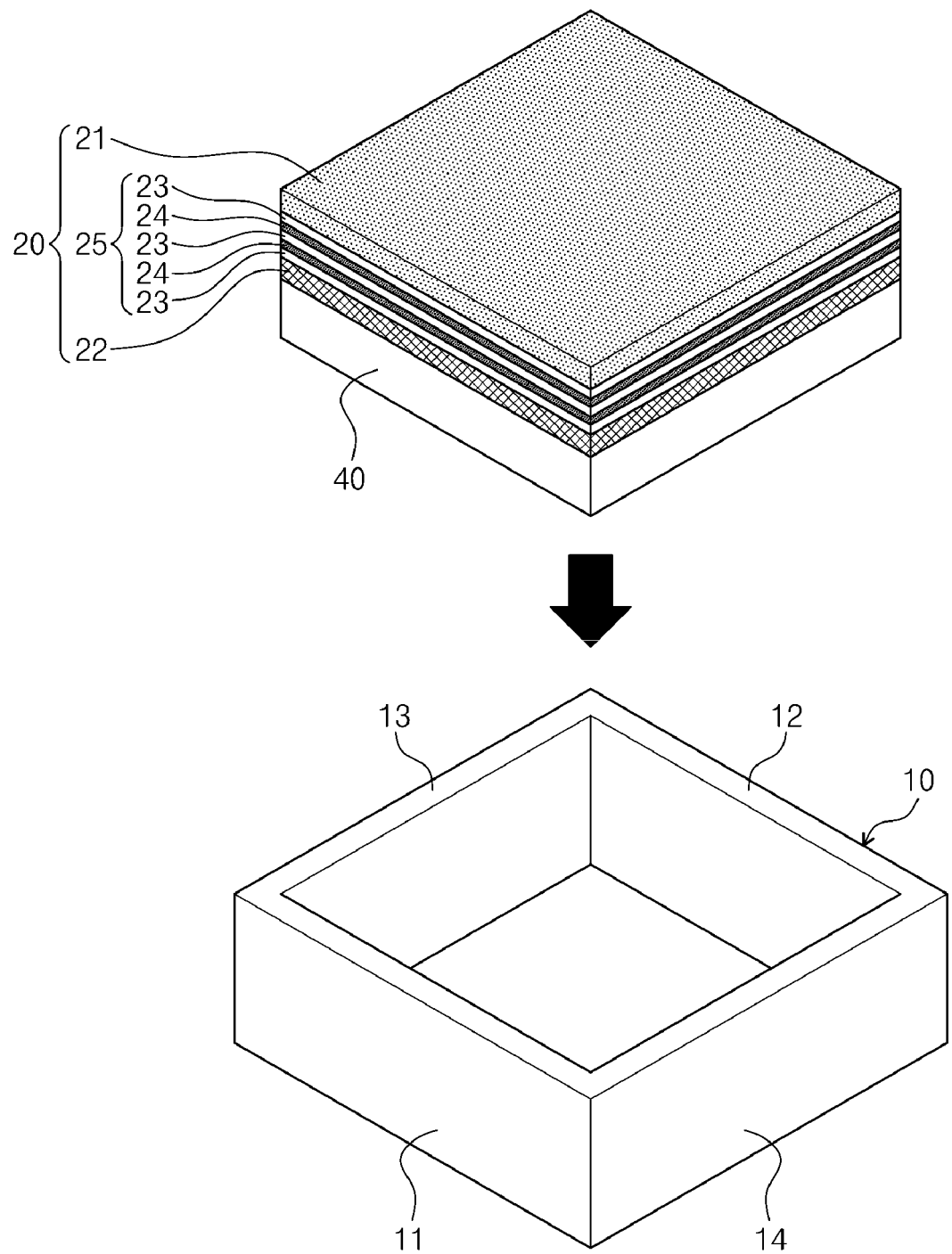

[Fig. 5]
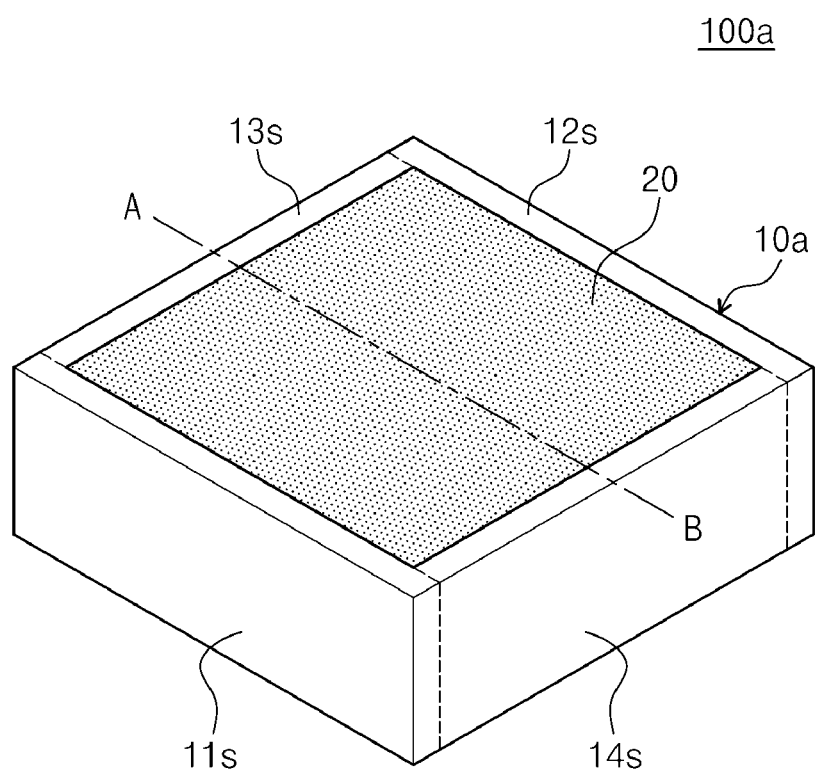

[Fig. 6]
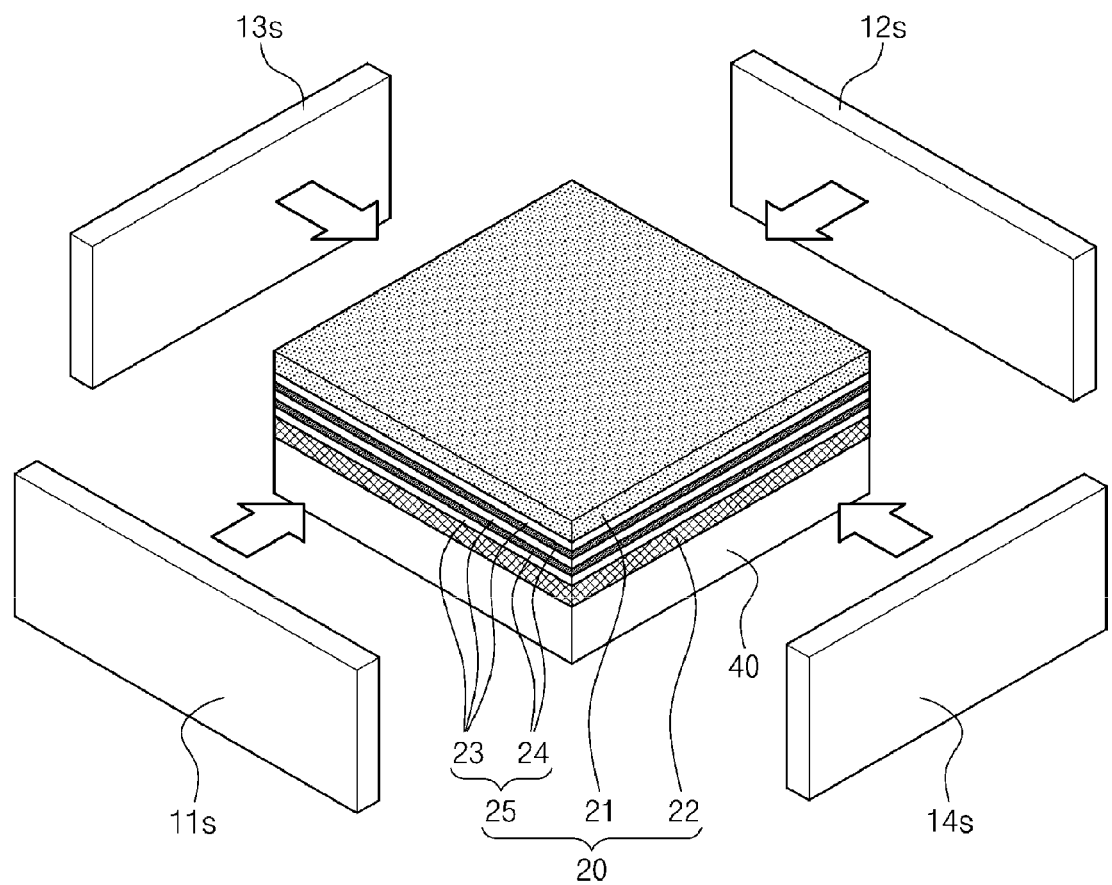

[Fig. 7]
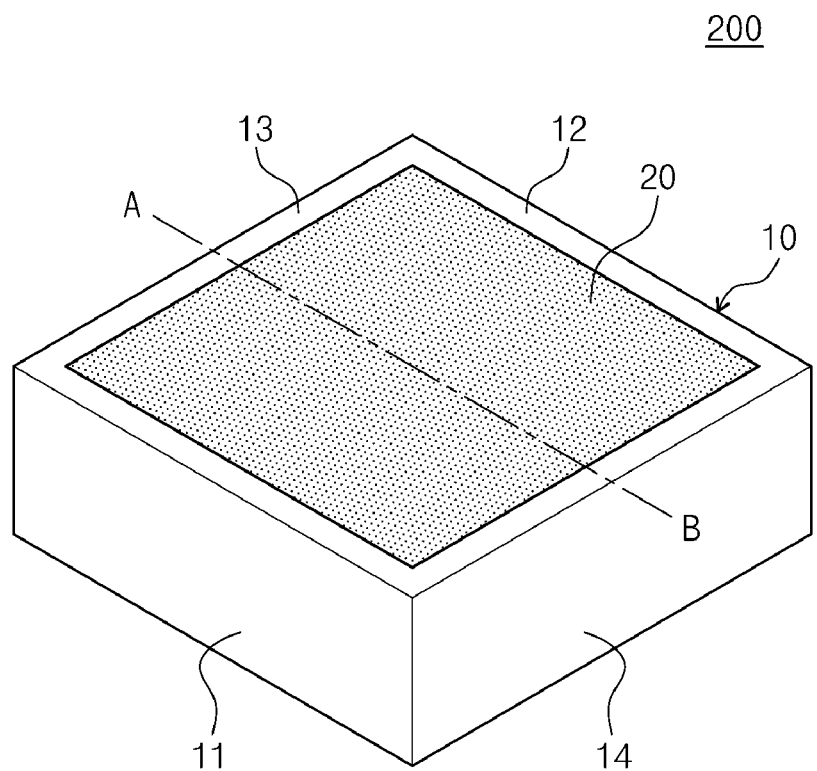
[Fig. 8]
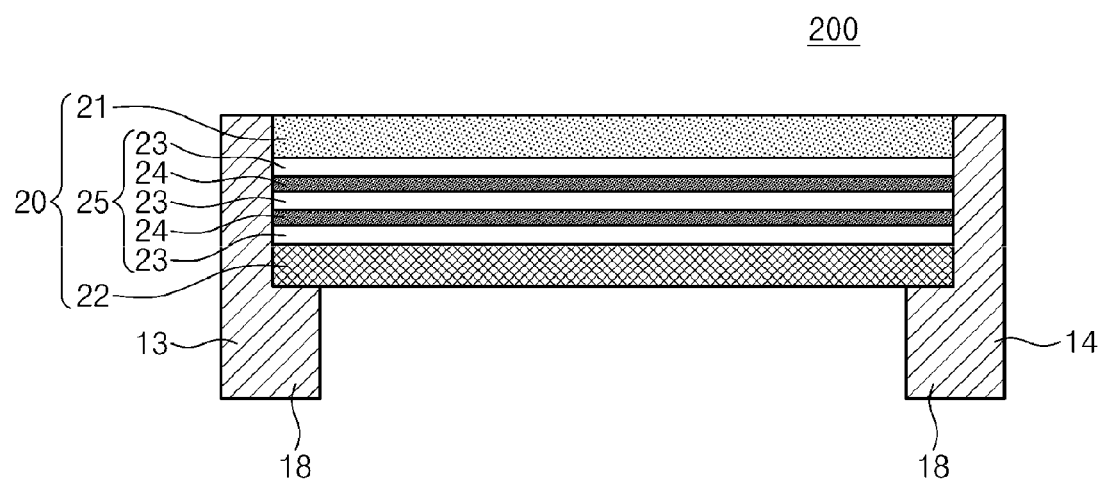

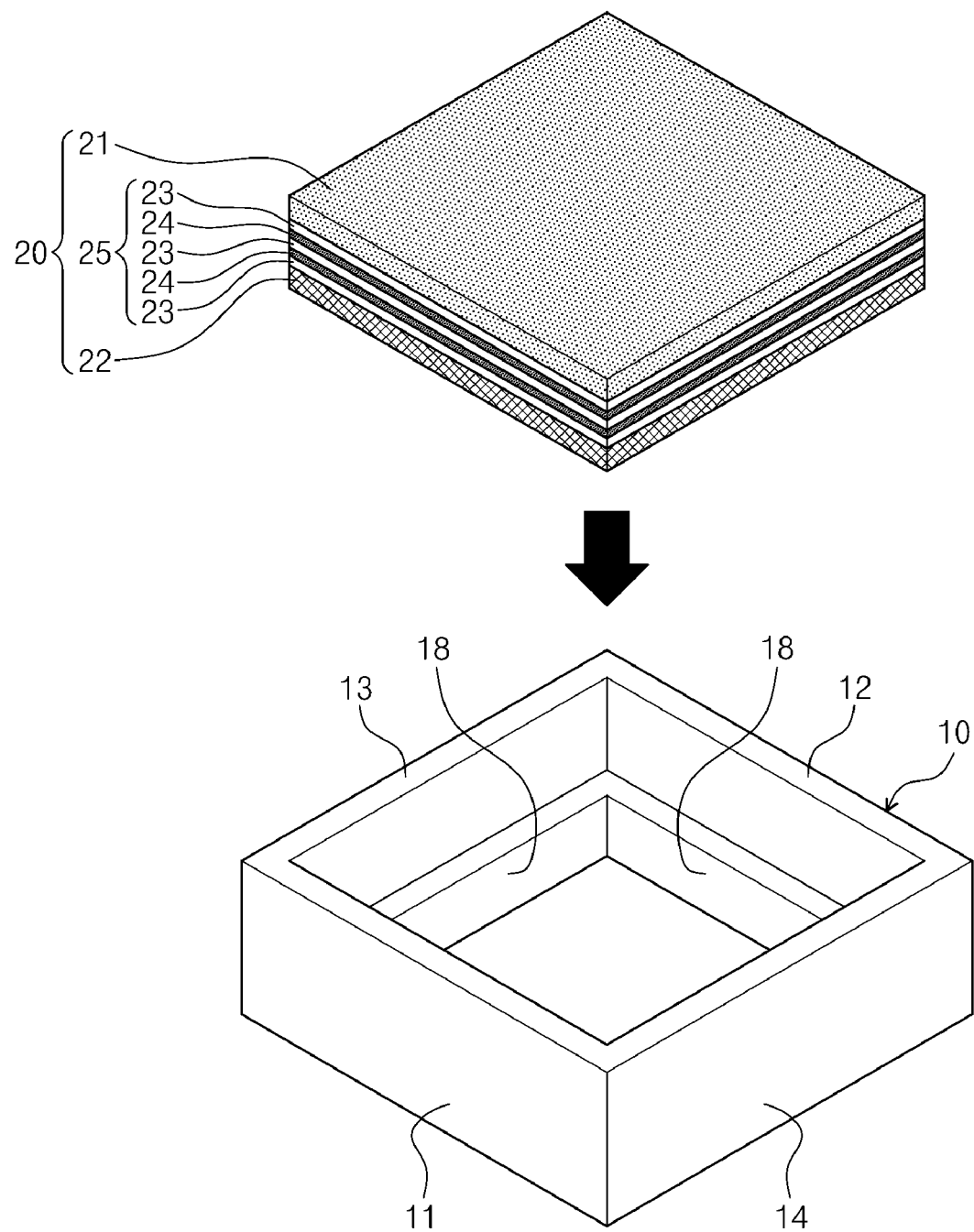
[Fig. 9]

[Fig. 10]
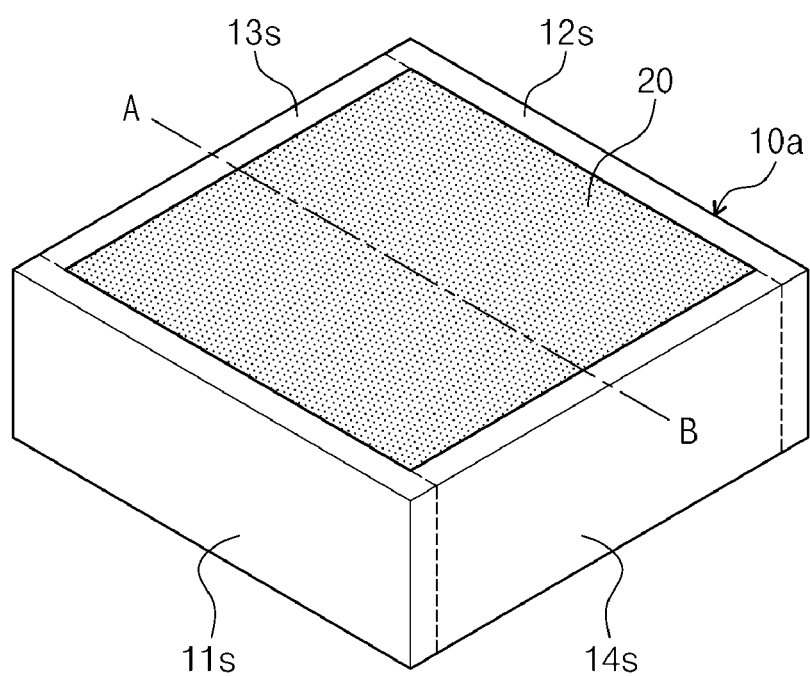

[Fig. 11]
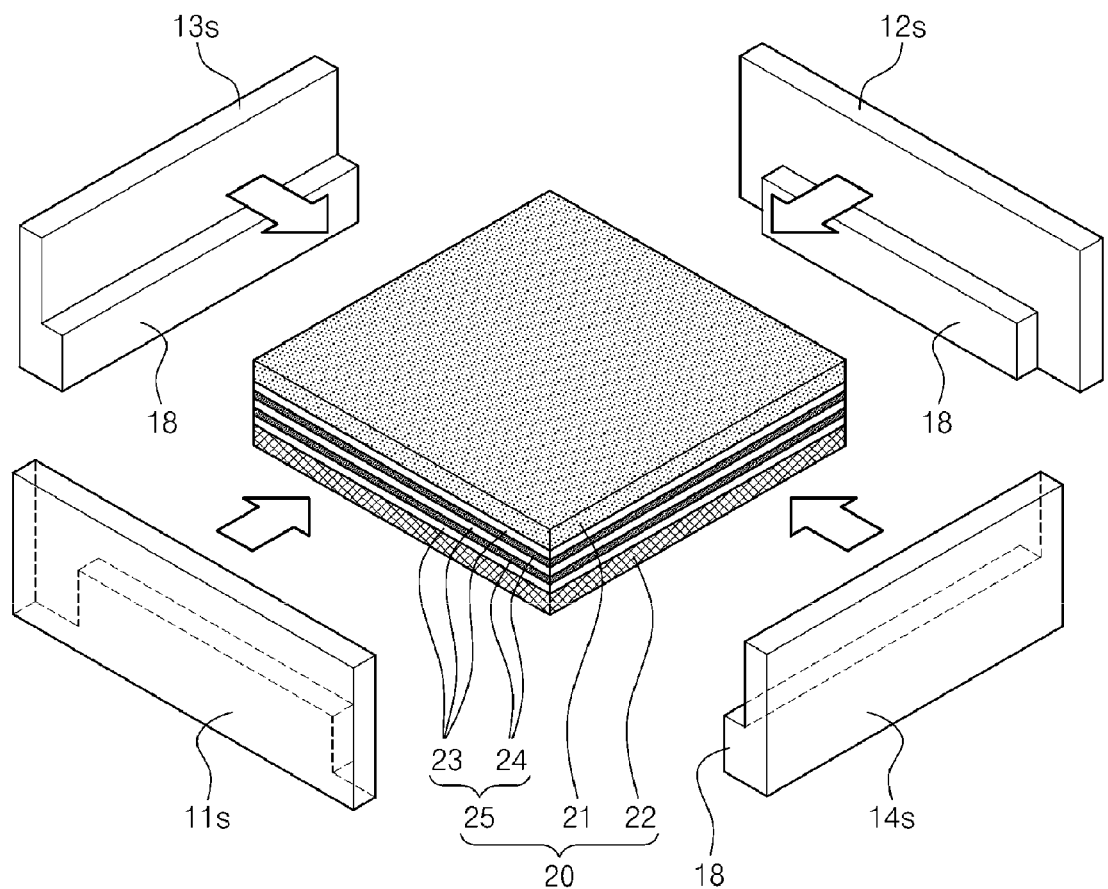

EUV PELLICLE STRUCTURE AND METHOD FOR MANUFACTURING SAME

CROSS-REFERENCE TO RELATED APPLICATION

This application is a continuation of pending International Application No. PCT/KR2017/000263, which was filed on Jan. 9, 2017 and claims priority to Korean Patent Application No. 10-2016-0009285, filed on Jan. 26, 2016, in the Korean Intellectual Property Office, the disclosures of which are hereby incorporated by reference in their entireties.

BACKGROUND

1. Field

The present disclosure herein relates to an extreme ultraviolet (EUV) pellicle structure and a method for manufacturing the same, and more particularly, to an EUV pellicle structure which includes: a pellicle membrane including a plurality of thin layers having excellent heat dissipation, chemical resistance and/or toughness; and a cooling structure absorbing heat from the pellicle membrane and releasing the heat, and a method for manufacturing the same.

2. Description of the Related Art

As line widths of circuits of semiconductor devices are rapidly reduced, there is a limitation in forming fine patterns by a currently used immersion ArF exposure apparatus using a light source having a wavelength band of 193 nm. Double exposure or quadruple exposure techniques are used to form fine patterns, without the development of a light source and an exposure apparatus. However, these techniques may cause an increase in the number of manufacturing processes of a semiconductor device, an increase in a process cost of the semiconductor device, and a decrease in the number of wafers processed per hour.

A next generation exposure apparatus using extreme ultraviolet (EUV) having a wavelength of 13.5 nm as a light source is being developed to solve these limitations. Since light having the wavelength of 13.5 nm used in an EUV lithography technique is absorbed in almost all materials, a reflection-type reticle (e.g., a mirror) is used instead of a typical transmission-type reticle in the EUV lithography technique. When an impurity such as dust or a foreign material is attached to the reticle, light may be absorbed or reflected by the impurity. Thus, a transferred pattern may be damaged to cause reduction in performance or yield of semiconductor devices or liquid crystal display panels. Therefore, a pellicle may be adhered to a surface of the reticle to prevent the impurity from being attached to the surface of the reticle. Thus, a pellicle having a high transmittance for the EUV and a thin thickness is being studied.

For example, Korean Patent Registration No. KR1552940B1 (Application No. KR20130157275A, Applicant: Samsung Electronics Co Ltd) discloses a method of manufacturing a graphite-containing thin layer which has a high EUV transmittance and strong tensile strength and is used as a pellicle layer for EUV lithography.

A technique of applying a high-power light source to an EUV lithography exposure apparatus is being studied to improve efficiency of a semiconductor manufacturing process. However, when the high-power light source is used, a temperature of a pellicle membrane may be rapidly increased to cause a bowing phenomenon in which the pellicle membrane is bent. Thus, a shape of a pattern may be damaged or the pellicle membrane may be broken. Thus, it may be required to study a method capable of inhibiting or preventing thermal deformation of the pellicle membrane which may be caused by an increase in temperature of the pellicle membrane.

SUMMARY

The present disclosure may provide an EUV pellicle structure with improved heat dissipation efficiency, and a method for manufacturing the same.

The present disclosure may also provide an EUV pellicle structure with an improved transmittance for EUV, and a method for manufacturing the same.

The present disclosure may further provide a method for manufacturing an EUV pellicle structure, which is capable of reducing a process time and a process cost.

The present disclosure may further provide a method for manufacturing an EUV pellicle structure, which is capable of easily mass-producing EUV masks or reticles.

The present disclosure may further provide a method for manufacturing an EUV pellicle structure, which is capable of easily manufacturing a full-sized EUV pellicle structure.

In an aspect, a method for manufacturing an extreme ultraviolet (EUV) pellicle structure may include preparing a pellicle membrane that includes an intermediate layer structure in which EUV transmission layers and heat dissipation layers are alternately stacked, a first thin layer disposed on a top surface of the intermediate layer structure, and a second thin layer disposed on a bottom surface of the intermediate layer structure and having a heat emissivity lower than that of the first thin layer, and disposing a cooling structure for absorbing heat from the pellicle membrane on an edge sidewall of the pellicle membrane at which the heat dissipation layers are exposed.

In an embodiment, the cooling structure may include first and second portions facing each other in a first direction and extending in parallel to each other, and third and fourth portions facing each other in a second direction intersecting the first direction and extending in parallel to each other. The first to fourth portions may constitute a single unitary body, and the disposing of the cooling structure may include inserting the pellicle membrane into the cooling structure of the single unitary body.

In an embodiment, the cooling structure may further include a receiving portion protruding from the first to fourth portions toward an inner space surrounded by the first to fourth portions. The disposing of the cooling structure may include disposing the pellicle membrane on the receiving portion of the cooling structure in such a way that the second thin layer is adjacent to the receiving portion, thereby inserting the pellicle membrane into the cooling structure.

In an embodiment, the cooling structure may include first and second segments facing each other in a first direction and extending in parallel to each other; and third and fourth segments facing each other in a second direction intersecting the first direction and extending in parallel to each other. The disposing of the cooling structure may include adhering the first to fourth segments to the pellicle membrane independently of each other.

In an embodiment, the cooling structure may further include a receiving portion protruding from the first to fourth segments toward an inner space surrounded by the first to fourth segments. The disposing of the cooling structure may include disposing the pellicle membrane on the receiving portion of the cooling structure in such a way that the second thin layer is adjacent to the receiving portion, thereby inserting the pellicle membrane comprising the first and second thin layers into the cooling structure.

In an embodiment, the heat dissipation layers may transfer heat absorbed from the EUV transmission layers to the cooling structure, and the cooling structure may emit heat absorbed from the EUV transmission layers and the heat dissipation layers to the outside.

In an embodiment, the first thin layer may radiate or emit heat absorbed from the EUV transmission layer to the outside.

In an embodiment, the method may further include preparing a pellicle frame, and adhering the pellicle frame onto the second thin layer of the pellicle membrane before the disposing of the cooling structure.

In an embodiment, the cooling structure may cover outer surfaces of the pellicle frame, the first thin layer and the second thin layer.

In an aspect, an extreme ultraviolet (EUV) pellicle structure may include an intermediate layer structure in which EUV transmission layers and heat dissipation layers are alternately stacked, a first thin layer adhered to a top surface of the intermediate layer structure, a second thin layer adhered to a bottom surface of the intermediate layer structure and having a heat emissivity lower than that of the first thin layer, and a cooling structure disposed on an edge sidewall of the pellicle membrane, at which the heat dissipation layers are exposed, to surround the pellicle membrane. The cooling structure may be configured to absorb heat from the pellicle membrane.

In an embodiment, the cooling structure may include an inner surface being in direct contact with the heat dissipation layers of the pellicle membrane to receive heat from the heat dissipation layers, and an outer surface for emitting heat to the outside.

In an embodiment, an outer surface of the cooling structure may have a protruding pattern shape.

In an embodiment, the cooling structure may further include a receiving portion protruding toward an inner space of the cooling structure, in which the pellicle membrane is disposed, and the pellicle membrane may be disposed on the receiving portion in such a way that the second thin layer is adjacent to the receiving portion.

In an embodiment, the EUV pellicle structure may further include a pellicle frame supporting the pellicle membrane and surrounded by the cooling structure.

BRIEF DESCRIPTION OF THE DRAWINGS

FIG. 1 is a perspective view illustrating an extreme ultraviolet (EUV) pellicle structure according to a first embodiment of the inventive concepts.

FIG. 2 is a cross-sectional view taken along a line A-B of FIG. 1 to illustrate the EUV pellicle structure according to the first embodiment of the inventive concepts.

FIG. 3 is a flowchart illustrating a method for manufacturing the EUV pellicle structure according to the first embodiment of the inventive concepts.

FIG. 4 is a view illustrating a method for manufacturing the EUV pellicle structure according to the first embodiment of the inventive concepts.

FIG. 5 is a perspective view illustrating an EUV pellicle structure according to a second embodiment of the inventive concepts.

FIG. 6 is a view illustrating a method for manufacturing the EUV pellicle structure according to the second embodiment of the inventive concepts.

FIG. 7 is a perspective view illustrating an EUV pellicle structure according to a third embodiment of the inventive concepts.

FIG. 8 is a cross-sectional view taken along a line A-B of FIG. 7 to illustrate the EUV pellicle structure according to the third embodiment of the inventive concepts.

FIG. 9 is a view illustrating a method for manufacturing the EUV pellicle structure according to the third embodiment of the inventive concepts.

FIG. 10 is a perspective view illustrating an EUV pellicle structure according to a fourth embodiment of the inventive concepts.

FIG. 11 is a view illustrating a method for manufacturing the EUV pellicle structure according to the fourth embodiment of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a perspective view illustrating an extreme ultraviolet (EUV) pellicle structure according to a first embodiment of the inventive concepts, and FIG. 2 is a cross-sectional view taken along a line A-B of FIG. 1 to illustrate the EUV pellicle structure according to the first embodiment of the inventive concepts.

Referring to FIGS. 1 and 2, an EUV pellicle structure 100 according to a first embodiment of the inventive concepts may include a pellicle membrane 20, a cooling structure 10, and a pellicle frame 40.

The pellicle membrane 20 may include an intermediate layer structure 25, a first thin layer 21, and a second thin layer 22.

The intermediate layer structure 25 may have a structure in which EUV transmission layers 23 and heat dissipation layers 24 are alternately stacked. According to an embodiment, the EUV transmission layer 23 may include a material of which an extinction coefficient for EUV is 0.01 or less, or a stabilized compound including the material of which the extinction coefficient for the EUV is 0.01 or less. For example, the EUV transmission layer 23 may include at least one of beryllium (Be), boron (B), carbon (C), silicon (Si), phosphorus (P), sulfur (S), potassium (K), calcium (Ca), scandium (Sc), bromine (Br), rubidium (Rb), strontium (Sr), yttrium (Y), zirconium (Zr), niobium (Nb), molybdenum (Mo), barium (Ba), lanthanum (La), cerium (Ce), praseodymium (Pr), and uranium (U), which are the materials of which the extinction coefficients for the EUV are equal to or less than 0.01. For another example, the EUV transmission layer 23 may include at least one of oxides, nitrides, carbides, and borides of the aforementioned materials having the extinction coefficients for the EUV of 0.01 or less. The oxides, nitrides, carbides and the borides may be the stabilized compounds of the materials having the extinction coefficients for the EUV of 0.01 or less. The EUV transmission layer 23 may need a thin thickness to improve a transmittance of the pellicle membrane 20 for the EUV. However, when the EUV transmission layer 23 includes the material having the low extinction coefficient as described above, an absorption rate of the EUV transmission layer 23 for the EUV may be low. Thus, the EUV transmission layer 23 may have a high transmittance even though the EUV transmission layer 23 has a relatively thick thickness. In an embodiment, the thickness of the EUV transmission layer 23 may be 100 nm or less.

According to an embodiment, the heat dissipation layer 24 may include a material of which a thermal conductivity is 10 W/mK or more at a temperature of 300K. For example, the heat dissipation layer 24 may include metals or carbon nano structures.

When the heat dissipation layer 24 includes the material having the high thermal conductivity as described above, thermal stress occurring in the pellicle membrane 20 may be dispersed to the periphery by the heat dissipation layer 24, and thus it is possible to minimize thermal stress concentrated to a portion of the pellicle membrane 20 which is exposed to the EUV. As a result, it is possible to minimize thermal deformation and physical breakage of the pellicle membrane 20 by the thermal stress. In detail, the heat dissipation layer 24 may absorb heat from the EUV transmission layer 23 and may release the absorbed heat to the cooling structure 10 to be described later in detail, and thus it is possible to minimize thermal deformation of the EUV transmission layer 23 which may be caused by heat accumulated in the EUV transmission layer 23 by continuous irradiation of the EUV.

In addition, the heat dissipation layer 24 may support the EUV transmission layer 23. As described above, the EUV transmission layer 23 may need a thin thickness to improve the transmittance of the pellicle membrane 20 for the EUV. A plurality of the heat dissipation layers 24 and a plurality of the EUV transmission layers 23 may be alternately stacked, and thus weak mechanical strength by the thin thickness of the EUV transmission layer 23 may be compensated. In an embodiment, the thickness of the heat dissipation layer 24 may be 100 nm or less.

In the case in which the EUV transmission layers 23 including the material having the low extinction coefficient and the heat dissipation layers 24 including the material having the high thermal conductivity are alternately stacked as described above, the pellicle membrane 20 may have an excellent transmittance for the EUV, excellent mechanical strength, and excellent thermal stability.

According to an embodiment, when the pellicle membrane 20 includes the EUV transmission layers 23 including silicon nitride ($SiN_x$) and the heat dissipation layers 24 respectively including graphene thin layers which are alternately stacked, a transmittance of the pellicle membrane 20 for the EUV may be 90% or more.

The first thin layer 21 may be disposed on a top surface of the intermediate layer structure 25. In an embodiment, the first thin layer 21 may include a material which has excellent radiation emission of heat and excellent chemical resistance to hydrogen ($H_2$). For example, the first thin layer 21 may include a material which has a heat emissivity of 0.1 or more at a temperature of 700K. For example, the first thin layer 21 may include titanium (Ti), tantalum (Ta), tungsten (W), molybdenum (Mo), chromium (Cr), cobalt (Co), boron (B), carbon (C), nickel (Ni), gold (Au), platinum (Pt), or a carbon nanostructure. For another example, the first thin layer 21 may include an oxide or mixture (e.g., alloy) of at least one of the materials described above. In an embodiment, a thickness of the first thin layer 21 may be 100 nm or less.

When the first thin layer 21 including the material having the excellent heat emissivity is disposed on the top surface of the intermediate layer structure 25 as described above, the first thin layer 21 may radiate heat, accumulated in the pellicle membrane 20 by continuous irradiation of the EUV, to the outside. Thus, it is possible to minimize thermal stress concentrated to the portion of the pellicle membrane 20 which is exposed to the EUV.

In addition, when the first thin layer 21 including the material having the excellent chemical resistance to hydrogen is disposed on the top surface of the intermediate layer structure 25, it is possible to inhibit or prevent the pellicle membrane 20 from being damaged by a chemical reaction of hydrogen radicals used in a cleaning process performed on an optical system in a lithography apparatus. In other words, the first thin layer 21 including the material having the excellent heat emissivity and the excellent chemical resistance to hydrogen may be disposed on the intermediate layer structure 25, and thus the pellicle membrane 20 with the excellent thermal durability and chemical resistance in an exposure process may be provided.

The second thin layer 22 may be disposed on a bottom surface of the intermediate layer structure 25. The second thin layer 22 may include a material of which a heat emissivity is lower than that of the first thin layer 21. When the heat emissivity of the second thin layer 22 is lower than the heat emissivity of the first thin layer 21, it is possible to minimize thermal damage of a mask disposed under the second thin layer 22 in the exposure process.

In addition, according to an embodiment, the second thin layer 22 may include a material of which a toughness is 1.6 Mpa·m$^{1/2}$ or more. For example, the second thin layer 22 may include zirconium (Zr), titanium (Ti), tungsten (W), tantalum (Ta), aluminum (Al), beryllium (Be), silicon (Si), or boron (B). For another example, the second thin layer 22 may include an oxide, carbide, boride or metal nitride of at least one of the materials described above. In an embodiment, a thickness of the second thin layer 22 may be 100 nm or less. The second thin layer 22 may support the EUV transmission layer 23, like the heat dissipation layer 24. As described above, the EUV transmission layer 23 may need a thin thickness to improve the transmittance of the pellicle membrane 20 for the EUV. Since the second thin layer 22 having the excellent toughness is disposed on the bottom surface of the intermediate layer structure 25, the mechanical strength weakened by the thin thickness of the EUV transmission layer 23 may be compensated.

The cooling structure 10 may include a first portion 11 and a second portion 12 which face each other in a first direction and extend in parallel to each other. The cooling structure 10 may also include a third portion 13 and a fourth portion 14 which face each other in a second direction intersecting the first direction and extend in parallel to each other. The first to fourth portions 11, 12, 13 and 14 of the cooling structure 10 may constitute a single unitary body. According to an embodiment, the cooling structure 10 may include a material of which an emissivity is 0.5 or more at a temperature of 300K. For example, the cooling structure 10 may include a metal oxide or a ceramic.

According to an embodiment, the cooling structure 10 may be disposed on an edge sidewall of the pellicle membrane 20 to surround the pellicle membrane 20. Here, the heat dissipation layers 24 may be exposed at the edge sidewall of the pellicle membrane 20. Thus, the cooling structure 10 may include an inner surface being in direct contact with the heat dissipation layers 24 of the pellicle membrane 20 to receive heat from the heat dissipation layers 24, and an outer surface for releasing or emitting the heat to the outside.

According to an embodiment, the outer surface of the cooling structure 10 may include a protruding pattern shape. Heat absorbed into the cooling structure 10 from the pellicle membrane 20 may be easily radiated or emitted from the cooling structure 10 by the protruding patterns formed at the outer surface of the cooling structure 10, and thus a cooling rate of the pellicle membrane 20 may be increased. According to an embodiment, the protruding pattern included in the outer surface of the cooling structure 10 may have a micro size or a nano size.

As described above, the heat absorbed from the EUV transmission layer 23 into the heat dissipation layer 24 may be transferred to the cooling structure 10. The cooling structure 10 may release or emit the heat absorbed from the EUV transmission layer 23 and the heat dissipation layer 24 to the outside. Thus, a temperature gradient may continuously occur between the EUV exposed portion of the pellicle membrane 20 and an edge of the pellicle membrane 20 to minimize the thermal stress occurring in the pellicle membrane 20. According to an embodiment, the cooling structure 10 may cover outer surfaces of the first and second thin layers 21 and 22. Thus, the cooling structure 10 may release heat to the outside from the first and second thin layers 21 and 22 as well as the EUV transmission layer 23 and the heat dissipation layer 24. As a result, thermal damage of the pellicle membrane 20 may be minimized.

The pellicle frame 40 may be adhered to a bottom surface of the pellicle membrane 20. In more detail, the pellicle frame 40 may extend along an edge of the bottom surface of the pellicle membrane 20, as illustrated in FIG. 2. In addition, an outer surface of the pellicle frame 40 may be covered with the cooling structure 10. The pellicle frame 40 may be adhered to the edge of the bottom surface of the pellicle membrane 20 as described above, and thus the pellicle frame 40 may support the pellicle membrane 20.

A method for manufacturing the EUV pellicle structure according to the first embodiment of the inventive concepts will be described hereinafter.

FIG. 3 is a flowchart illustrating a method for manufacturing the EUV pellicle structure according to the first embodiment of the inventive concepts, and FIG. 4 is a view illustrating a method for manufacturing the EUV pellicle structure according to the first embodiment of the inventive concepts.

Referring to FIGS. 3 and 4, the pellicle membrane 20 may be prepared (S100). The pellicle membrane 20 may include the intermediate layer structure 25 in which the EUV transmission layers 23 and the heat dissipation layers 24 are alternately stacked, the first thin layer 21 on the top surface of the intermediate layer structure 25, and the second thin layer 22 disposed on the bottom surface of the intermediate layer structure 25 and having the heat emissivity lower than that of the first thin layer 21. As described with reference to FIGS. 1 and 2, the EUV transmission layer 23 included in the intermediate layer structure 25 may include a material of which an extinction coefficient for EUV is 0.01 or less, or the stabilized compound of the material of which the extinction coefficient for the EUV is 0.01 or less. In addition, according to an embodiment, the heat dissipation layer 24 included in the intermediate layer structure 25 may include a material of which a thermal conductivity is 10 W/mK or more at a temperature of 300K.

As described above, when the EUV transmission layer 23 includes the material having the low extinction coefficient, an absorption rate of the EUV transmission layer 23 for the EUV may be low. Thus, the EUV transmission layer 23 having a high transmittance may be formed even though the EUV transmission layer 23 has a relatively thick thickness. In addition, when the heat dissipation layer 24 includes the material having the high thermal conductivity, thermal stress occurring in the pellicle membrane 20 may be dispersed to the periphery by the heat dissipation layer 24, and thus it is possible to minimize thermal stress concentrated to a portion of the pellicle membrane 20 which is exposed to the EUV. As a result, when the pellicle membrane 20 is formed to have the structure in which the EUV transmission layers 23 including the material of the low extinction coefficient and the heat dissipation layers 24 including the material of the high thermal conductivity are alternately stacked, the pellicle membrane 20 may have the excellent transmittance for the EUV, the excellent mechanical strength, and the excellent thermal stability.

In addition, the first thin layer 21 having the excellent heat emissivity and the excellent chemical resistance to hydrogen may be disposed on the top surface of the intermediate layer structure 25, as described above. Thus, heat accumulated in the pellicle membrane 20 by continuous irradiation of the EUV may be effectively radiated or emitted to the outside through the first thin layer 21. As a result, thermal damage of the pellicle membrane 20 may be minimized. In addition, the second thin layer 22 having the excellent toughness and the heat emissivity lower than that of the first thin layer 21 may be disposed on the bottom surface of the intermediate layer structure 25. Thus, mechanical strength of the pellicle membrane 20 weakened by the thin thickness of the EUV transmission layer 23 may be compensated by the second thin layer 22.

Before the cooling structure 10 is disposed at an edge of the pellicle membrane 20, the pellicle frame 40 may be adhered to the edge of the bottom surface of the pellicle membrane 20. In other words, the pellicle membrane 20 may be adhered on the pellicle frame 40. The pellicle frame 40 may be adhered to the bottom surface of the pellicle membrane 20 to support the pellicle membrane 20, as described above.

The cooling structure 10 for absorbing heat from the pellicle membrane 20 may be disposed on the edge sidewall of the pellicle membrane 20 at which the heat dissipation layers 24 are exposed (S200). As described with reference to FIGS. 1 and 2, the cooling structure 10 may include the first to fourth portions 11, 12, 13 and 14, and the first to fourth portions 11, 12, 13 and 14 may constitute a single unitary body. In addition, the protruding patterns may be formed on the outer surface of the cooling structure 10 to easily radiate or emit the heat absorbed from the pellicle membrane 20 into the cooling structure 10.

As illustrated in FIG. 4, the pellicle membrane 20 having the bottom surface to which the pellicle frame 40 is adhered may be inserted into the cooling structure 10 of the single unitary body. Thus, the cooling structure 10 may cover the edge sidewall of the pellicle membrane 20 and the outer surface of the pellicle frame 40.

As described above, the heat absorbed from the EUV transmission layer 23 into the heat dissipation layer 24 may be transferred to the cooling structure 10. The cooling structure 10 may release or emit the heat, which is absorbed from the first and second thin layers 21 and 22 as well as the EUV transmission layers 23 and the heat dissipation layers 24, to the outside. Thus, the thermal durability of the pellicle membrane 20 may be improved. However, the amount of the heat which is absorbed from the EUV transmission layer 23 and the heat dissipation layer 24 by the cooling structure 10 and is emitted to the outside by the cooling structure 10 may be greater than the amount of the heat which is absorbed from the first and second thin layers 21 and 22 by the cooling structure 10 and is emitted to the outside by the cooling structure 10.

An EUV pellicle structure according to a second embodiment of the inventive concepts will be described hereinafter.

The EUV pellicle structure 100 according to the first embodiment may include the cooling structure 10 of the single unitary body, but an EUV pellicle structure 100a according to the second embodiment may include a cooling structure 10a having a divided structure. In detail, the cooling structure 10a according to the second embodiment may include first, second, third and fourth segments 11s, 12s, 13s and 14s obtained by dividing the first, second, third and fourth portions 11, 12, 13 and 14 of the cooling structure 10 according to the first embodiment. The first to fourth segments 11s, 12s, 13s and 14s of the cooling structure 10a may be coupled to each other.

FIG. 5 is a perspective view illustrating an EUV pellicle structure according to a second embodiment of the inventive concepts. In the second embodiment of FIG. 5, the descriptions to the same technical features as in the first embodiment of FIGS. 1 and 2 will be omitted or mentioned briefly for the purpose of ease and convenience in explanation. A cross-sectional view of the EUV pellicle structure 100a of the second embodiment which is taken along a line A-B of FIG. 5 is substantially the same as the cross-sectional view of FIG. 2 which illustrates the EUV pellicle structure 100 according to the first embodiment.

Referring to FIGS. 5 and 2, the EUV pellicle structure 100a according to the second embodiment of the inventive concepts may include the pellicle membrane 20, the cooling structure 10a, and the pellicle frame 40.

As described with reference to the EUV pellicle structure 100 according to the first embodiment, the pellicle membrane 20 may include the intermediate layer structure 25, the first thin layer 21 disposed on the top surface of the intermediate layer structure 25, and the second thin layer 22 disposed on the bottom surface of the intermediate layer structure 25. The intermediate layer structure 25 may have the structure in which the EUV transmission layers 23 including the material having the low extinction coefficient and the heat dissipation layers 24 including the material having the high thermal conductivity are alternately stacked. Thus, the pellicle membrane 20 with the excellent transmittance for the EUV, mechanical strength and thermal stability may be provided. In addition, as described above, the first thin layer 21 may include the material having the excellent radiation emission of heat and the excellent chemical resistance to hydrogen, and the second thin layer 22 may include the material having the excellent toughness and the heat emissivity lower than that of the first thin layer 21. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

The cooling structure 10a may have the divided structure, unlike the cooling structure 10 having the single unitary body in the EUV pellicle structure 100 according to the first embodiment of the inventive concepts. In more detail, the cooling structure 10a may include the first segment 11s and the second segment 12s facing each other in the first direction and extending in parallel to each other, and the third segment 13s and the fourth segment 14s facing each other in the second direction intersecting the first direction and extending in parallel to each other.

According to an embodiment, the first to fourth segments 11s, 12s, 13s and 14s of the cooling structure 10a may be disposed independently of each other on the edge sidewall of the pellicle membrane 20, at which the heat dissipation layers 24 are exposed, to surround the pellicle membrane 20. Thus, the cooling structure 10a may include an inner surface being in direct contact with the heat dissipation layers 24 of the pellicle membrane 20 to receive heat from the heat dissipation layers 24, and an outer surface for releasing or emitting the heat to the outside. In addition, according to an embodiment, the outer surface of the cooling structure 10a may include the protruding patterns to easily radiate or emit the heat absorbed from the pellicle membrane 20 into the cooling structure 10a, as described above.

When the first to fourth segments 11s, 12s, 13s and 14s of the cooling structure 10a are disposed independently of each other on the edge sidewall of the pellicle membrane 20 as described above, the cooling structure 10a may be disposed to be closer to the pellicle membrane 20 along a shape of the edge sidewall of the pellicle membrane 20. Thus, a contact efficiency between the cooling structure 10a and the pellicle membrane 20 may be improved to maximize a heat dissipation efficiency from the pellicle membrane 20 to the cooling structure 10a. Since the heat dissipation efficiency in which the heat accumulated in the pellicle membrane 20 is released to the outside through the cooling structure 10*a* is improved, thermal stress occurring in the pellicle membrane 20 may be minimized.

The pellicle frame 40 may extend along and be adhered to the edge of the bottom surface of the pellicle membrane 20, as described in the EUV pellicle structure 100 according to the first embodiment of the inventive concepts. In addition, the outer surface of the pellicle frame 40 may be covered with the cooling structure 10*a*. The pellicle frame 40 may be adhered to the bottom surface of the pellicle membrane 20 as described above, and thus the pellicle frame 40 may support the pellicle membrane 20.

A method for manufacturing the EUV pellicle structure according to the second embodiment of the inventive concepts will be described hereinafter.

FIG. 6 is a view illustrating a method for manufacturing the EUV pellicle structure according to the second embodiment of FIG. 6. In the second embodiment of FIG. 6, the descriptions to the same technical features as in the first embodiment of FIGS. 1 to 4 will be omitted or mentioned briefly for the purpose of ease and convenience in explanation. In addition, a flowchart for explaining a method for manufacturing the EUV pellicle structure according to the second embodiment may be substantially the same as the flowchart of FIG. 3 which explains the method for manufacturing the EUV pellicle structure according to the first embodiment.

Referring to FIGS. 3 and 5, the pellicle membrane 20 may be prepared (S100). The pellicle membrane 20 may include the intermediate layer structure 25 in which the EUV transmission layers 23 and the heat dissipation layers 24 are alternately stacked, the first thin layer 21 on the top surface of the intermediate layer structure 25, and the second thin layer 22 disposed on the bottom surface of the intermediate layer structure 25 and having the heat emissivity lower than that of the first thin layer 21. As described above, when the pellicle membrane 20 is formed using the intermediate layer structure 25 which includes the EUV transmission layers 23 including the material of the low extinction coefficient and the heat dissipation layers 24 including the material of the high thermal conductivity, the pellicle membrane 20 may have the excellent transmittance for the EUV, the excellent mechanical strength, and the excellent thermal stability. In addition, the first thin layer 21 including the material having the excellent radiation emission of heat and the excellent chemical resistance to hydrogen may be disposed on the top surface of the intermediate layer structure 25, and the second thin layer 22 including the material having the excellent toughness and the heat emissivity lower than that of the first thin layer 21 may be disposed on the bottom surface of the intermediate layer structure 25. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

Before the cooling structure 10*a* is disposed on the edge sidewall of the pellicle membrane 20, the pellicle frame 40 may be adhered to the edge of the bottom surface of the pellicle membrane 20. The pellicle frame 40 may be adhered to the edge of the bottom surface of the pellicle membrane 20 to support the pellicle membrane 20, as described above.

The cooling structure 10*a* for absorbing heat from the pellicle membrane 20 may be disposed on the edge sidewall of the pellicle membrane 20 at which the heat dissipation layers 24 are exposed (S200). As illustrated in FIG. 6, the first to fourth segments 11*s*, 12*s*, 13*s* and 14*s* of the cooling structure 10*a* may be adhered independently of each other to the pellicle membrane 20. As described above, when the first to fourth segments 11*s*, 12*s*, 13*s* and 14*s* of the cooling structure 10*a* are disposed independently of each other on the edge sidewall of the pellicle membrane 20, the cooling structure 10*a* may be disposed to be closer to the pellicle membrane 20 along the shape of the edge sidewall of the pellicle membrane 20, and thus the heat dissipation efficiency from the pellicle membrane 20 to the cooling structure 10*a* may be improved. As a result, the thermal stress occurring in the pellicle membrane 20 may be reduced to minimize thermal deformation and physical breakage of the pellicle membrane 20.

An EUV pellicle structure according to a third embodiment of the inventive concepts will be described hereinafter.

The pellicle frame 40 of the EUV pellicle structure 100 according to the first embodiment may be omitted in an EUV pellicle structure 200 according to the third embodiment of the inventive concepts. The pellicle frame 40 of the EUV pellicle structure 100 according to the first embodiment may be replaced with a receiving portion 18 formed at a cooling structure 10 of the EUV pellicle structure 200 according to the third embodiment of the inventive concepts.

FIG. 7 is a perspective view illustrating an EUV pellicle structure according to a third embodiment of the inventive concepts, and FIG. 8 is a cross-sectional view taken along a line A-B of FIG. 7 to illustrate the EUV pellicle structure according to the third embodiment of the inventive concepts. In the third embodiment of FIGS. 7 and 8, the descriptions to the same technical features as in the first embodiment of FIGS. 1 and 2 will be omitted or mentioned briefly for the purpose of ease and convenience in explanation.

Referring to FIGS. 7 and 8, the EUV pellicle structure 200 according to the third embodiment of the inventive concepts may include a pellicle membrane 20 and a cooling structure 10.

As described with reference to the EUV pellicle structure 100 according to the first embodiment, the pellicle membrane 20 may include the intermediate layer structure 25, the first thin layer 21 disposed on the top surface of the intermediate layer structure 25, and the second thin layer 22 disposed on the bottom surface of the intermediate layer structure 25. The intermediate layer structure 25 may have the structure in which the EUV transmission layers 23 including the material having the low extinction coefficient and the heat dissipation layers 24 including the material having the high thermal conductivity are alternately stacked. Thus, the pellicle membrane 20 with the excellent transmittance for the EUV, mechanical strength and thermal stability may be provided.

In addition, as described above, the first thin layer 21 may include the material having the excellent radiation emission of heat and the excellent chemical resistance to hydrogen, and the second thin layer 22 may include the material having the excellent toughness and the heat emissivity lower than that of the first thin layer 21. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

The cooling structure 10 may include the first to fourth portions 11, 12, 13 and 14, as described in the EUV pellicle structure 100 according to the first embodiment of the inventive concepts. Here, the first to fourth portions 11, 12, 13 and 14 may constitute a single unitary body. In addition, the cooling structure 10 of the EUV pellicle structure 200 according to the third embodiment may further include the receiving portion 18 that protrudes from the first to fourth portions 11, 12, 13 and 14 toward an inner space surrounded by the first to fourth portions 11, 12, 13 and 14. As described above, the receiving portion 18 may replace the pellicle frame 40 of each of the EUV pellicle structures 100 and 100a according to the first and second embodiments of the inventive concepts. The pellicle membrane 20 may be disposed on the receiving portion 18 of the cooling structure 10 in such a way that the second thin layer 22 is adjacent to the receiving portion 18, and thus the receiving portion 18 may support the pellicle membrane 20, like the pellicle frame 40. Processes of forming and assembling the pellicle frame 40 may be omitted in the EUV pellicle structure 200 which includes the cooling structure 10 having the receiving portion 18, and thus processes of manufacturing the EUV pellicle structure 200 may be simplified. As a result, a process time and a process cost of the EUV pellicle structure 200 may be reduced.

In addition, according to an embodiment, the protruding patterns may be formed on the outer surface of the cooling structure 10 to easily radiate or emit the heat absorbed from the pellicle membrane 20 into the cooling structure 10, as described above. Thus, a cooling rate of the pellicle membrane 20 may be increased to minimize thermal deformation and physical breakage of the pellicle membrane 20.

A method for manufacturing the EUV pellicle structure according to the third embodiment of the inventive concepts will be described hereinafter.

FIG. 9 is a view illustrating a method for manufacturing the EUV pellicle structure according to the third embodiment of the inventive concepts. In the method for manufacturing the EUV pellicle structure according to the third embodiment of FIG. 9, the descriptions to the same technical features as in the first embodiment of FIGS. 3 and 4 will be omitted or mentioned briefly for the purpose of ease and convenience in explanation. In addition, a flowchart for explaining the method for manufacturing the EUV pellicle structure according to the third embodiment may be substantially the same as the flowchart of FIG. 3 which explains the method for manufacturing the EUV pellicle structure according to the first embodiment.

Referring to FIGS. 3 and 9, the pellicle membrane 20 may be prepared (S100). The pellicle membrane 20 may include the intermediate layer structure 25 in which the EUV transmission layers 23 and the heat dissipation layers 24 are alternately stacked, the first thin layer 21 on the top surface of the intermediate layer structure 25, and the second thin layer 22 disposed on the bottom surface of the intermediate layer structure 25 and having the heat emissivity lower than that of the first thin layer 21. As described above, when the pellicle membrane 20 is formed using the intermediate layer structure 25 which includes the EUV transmission layers 23 including the material of the low extinction coefficient and the heat dissipation layers 24 including the material of the high thermal conductivity, the pellicle membrane 20 may have the excellent transmittance for the EUV, the excellent mechanical strength, and the excellent thermal stability.

In addition, the first thin layer 21 including the material having the excellent radiation emission of heat and the excellent chemical resistance to hydrogen may be disposed on the top surface of the intermediate layer structure 25, and the second thin layer 22 including the material having the excellent toughness and the heat emissivity lower than that of the first thin layer 21 may be disposed on the bottom surface of the intermediate layer structure 25. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

The cooling structure 10 for absorbing heat from the pellicle membrane 20 may be disposed on the edge sidewall of the pellicle membrane 20 at which the heat dissipation layers 24 are exposed (S200). As described with reference to FIGS. 1 and 2, the cooling structure 10 may include the first to fourth portions 11, 12, 13 and 14, and the first to fourth portions 11, 12, 13 and 14 may constitute a single unitary body. In an embodiment, the protruding patterns may be formed on the outer surface of the cooling structure 10 to easily radiate or emit the heat absorbed from the pellicle membrane 20 into the cooling structure 10.

In addition, according to the third embodiment, the cooling structure 10 may further include the receiving portion 18 that protrudes from the first to fourth portions 11, 12, 13 and 14 toward the inner space surrounded by the first to fourth portions 11, 12, 13 and 14, as described with reference to FIGS. 7 and 8. According to the third embodiment, the pellicle membrane 20 may be disposed on the receiving portion 18 of the cooling structure 10 in such a way that the second thin layer 22 is adjacent to the receiving portion 18, and thus the pellicle membrane 20 may be inserted in the cooling structure 20. The receiving portion 18 of the cooling structure 10 may replace the pellicle frame 40 of each of the EUV pellicle structures 100 and 100a according to the first and second embodiments of the inventive concepts. Thus, the receiving portion 18 of the cooling structure 10 may support the pellicle membrane 20.

When the pellicle membrane 20 is inserted in the cooling structure 10 having the receiving portion 18 as described above, the process of adhering the pellicle membrane 20 onto the pellicle frame 40 may be omitted before disposing the cooling structure 10 on the edge sidewall of the pellicle membrane 20, unlike the methods for manufacturing the EUV pellicle structures 100 and 100a according to the first and second embodiments of the inventive concepts. Thus, manufacturing processes may be simplified, and a process time and a process cost may be reduced.

In addition, according to the first and second embodiments of the inventive concepts, each of the cooling structures 10 and 10a of the EUV pellicle structures 100 and 100a may be adhered to the edge sidewall of the pellicle membrane 20 and the outer surface of the pellicle frame 40, and thus contact surfaces may be formed between the pellicle membrane 20 and each of the cooling structures 10 and 10a and between the pellicle frame 40 and each of the cooling structures 10 and 10a, respectively. On the other hand, according to the third embodiment of the inventive concepts, the cooling structure 10 of the EUV pellicle structure 200 may be adhered to the edge sidewall of the pellicle membrane 20 and the edge of the bottom surface of the pellicle membrane 20, and thus a contact surface may be formed between the pellicle membrane 20 and the cooling structure 10. In other words, according to the third embodiment, components of the EUV pellicle structure 200 may be simplified and the number of contact surfaces between the components may be reduced. Thus, in the third embodiment, the pellicle membrane 20 and the cooling structure 10 may be adhered more closely to each other to improve contact efficiency between the cooling structure 10 and the pellicle membrane 20. As a result, the heat dissipation efficiency from the pellicle membrane 20 to the outside through the cooling structure 10 may be improved, and thus thermal durability of the pellicle membrane 20 may be improved.

An EUV pellicle structure according to a fourth embodiment of the inventive concepts will be described hereinafter.

An EUV pellicle structure 200a according to the fourth embodiment may include a cooling structure 10a having a divided structure, like the EUV pellicle structure 100a according to the second embodiment described above. However, the cooling structure 10a of the EUV pellicle structure 200a according to the fourth embodiment may include first, second, third and fourth segments 11s, 12s, 13s and 14s obtained by dividing the first, second, third and fourth portions 11, 12, 13 and 14 having the receiving portion 18 in the cooling structure 10 according to the third embodiment. The first to fourth segments 11s, 12s, 13s and 14s of the cooling structure 10a may be coupled to each other.

FIG. 10 is a perspective view illustrating an EUV pellicle structure according to a fourth embodiment of the inventive concepts. In the fourth embodiment of FIG. 10, the descriptions to the same technical features as in the second and third embodiments of FIGS. 5 to 8 will be omitted or mentioned briefly for the purpose of ease and convenience in explanation. A cross-sectional view of the EUV pellicle structure 200a of the fourth embodiment which is taken along a line A-B of FIG. 10 is substantially the same as the cross-sectional view of FIG. 8 which illustrates the EUV pellicle structure 200 according to the third embodiment.

Referring to FIGS. 10 and 8, the EUV pellicle structure 200a according to the fourth embodiment of the inventive concepts may include a pellicle membrane 20 and a cooling structure 10a.

As described with reference to the EUV pellicle structure 100 according to the first embodiment, the pellicle membrane 20 may include the intermediate layer structure 25, the first thin layer 21 disposed on the top surface of the intermediate layer structure 25, and the second thin layer 22 disposed on the bottom surface of the intermediate layer structure 25. The intermediate layer structure 25 may have the structure in which the EUV transmission layers 23 including the material having the low extinction coefficient and the heat dissipation layers 24 including the material having the high thermal conductivity are alternately stacked. Thus, the pellicle membrane 20 with the excellent transmittance for the EUV, mechanical strength and thermal stability may be provided.

In addition, as described above, the first thin layer 21 may include the material having the excellent radiation emission of heat and the excellent chemical resistance to hydrogen, and the second thin layer 22 may include the material having the excellent toughness and the heat emissivity lower than that of the first thin layer 21. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

As described above, the cooling structure 10a may include the first, second, third and fourth segments 11s, 12s, 13s and 14s obtained by dividing the first, second, third and fourth portions 11, 12, 13 and 14 having the receiving portion 18 in the cooling structure 10 according to the third embodiment. The first to fourth segments 11s, 12s, 13s and 14s of the cooling structure 10a may be coupled to each other.

According to an embodiment, the first to fourth segments 11s, 12s, 13s and 14s of the cooling structure 10a, which have the receiving portion 18, may be disposed independently of each other on the edge sidewall of the pellicle membrane 20, at which the heat dissipation layers 24 are exposed, to surround the pellicle membrane 20. Here, the pellicle membrane 20 may be disposed on the receiving portion 18 of the cooling structure 10a in such a way that the second thin layer 22 is adjacent to the receiving portion 18.

When the first to fourth segments 11s, 12s, 13s and 14s of the cooling structure 10a are disposed independently of each other on the edge sidewall of the pellicle membrane 20 as described above, the cooling structure 10a may be disposed to be closer to the pellicle membrane 20 along a shape of the edge sidewall of the pellicle membrane 20.

In addition, when the pellicle membrane 20 is inserted in an inner space surrounded by the first to fourth segments 11s, 12s, 13s and 14s which have the receiving portion 18 replacing the pellicle frame 40, components of the EUV pellicle structure 200a may be simplified and the number of contact surfaces between the components may be reduced. Thus, the pellicle membrane 20 and the cooling structure 10a may be adhered more closely to each other to improve contact efficiency between the cooling structure 10a and the pellicle membrane 20. As a result, the heat dissipation efficiency from the pellicle membrane 20 to the outside through the cooling structure 10a may be improved, and thus thermal stability of the pellicle membrane 20 may be improved.

A method for manufacturing the EUV pellicle structure according to the fourth embodiment of the inventive concepts will be described hereinafter.

FIG. 11 is a view illustrating a method for manufacturing the EUV pellicle structure according to the fourth embodiment of the inventive concepts. In the method for manufacturing the EUV pellicle structure according to the fourth embodiment of FIG. 11, the descriptions to the same technical features as in the second, third and fourth embodiments of FIGS. 5 to 10 will be omitted or mentioned briefly for the purpose of ease and convenience in explanation. In addition, a flowchart for explaining the method for manufacturing the EUV pellicle structure according to the fourth embodiment may be substantially the same as the flowchart of FIG. 3 which explains the method for manufacturing the EUV pellicle structure according to the first embodiment.

Referring to FIGS. 3 and 11, the pellicle membrane 20 may be prepared (S100). The pellicle membrane 20 may include the intermediate layer structure 25 in which the EUV transmission layers 23 and the heat dissipation layers 24 are alternately stacked, the first thin layer 21 on the top surface of the intermediate layer structure 25, and the second thin layer 22 disposed on the bottom surface of the intermediate layer structure 25 and having the heat emissivity lower than that of the first thin layer 21. As described above, when the pellicle membrane 20 is formed using the intermediate layer structure 25 which includes the EUV transmission layers 23 including the material of the low extinction coefficient and the heat dissipation layers 24 including the material of the high thermal conductivity, the pellicle membrane 20 may have the excellent transmittance for the EUV, the excellent mechanical strength, and the excellent thermal stability.

In addition, the first thin layer 21 including the material having the excellent radiation emission of heat and the excellent chemical resistance to hydrogen may be disposed on the top surface of the intermediate layer structure 25, and the second thin layer 22 including the material having the excellent toughness and the heat emissivity lower than that of the first thin layer 21 may be disposed on the bottom surface of the intermediate layer structure 25. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

The cooling structure 10a for absorbing heat from the pellicle membrane 20 may be disposed on the edge sidewall of the pellicle membrane 20 at which the heat dissipation layers 24 are exposed (S200). As described with reference to FIG. 10, the pellicle membrane 20 may be disposed on the receiving portion 18 of the cooling structure 10a in such a way that the second thin layer 22 is adjacent to the receiving portion 18, and thus the pellicle membrane 20 may be inserted into the cooling structure 10a. In detail, the first to fourth segments 11s, 12s, 13s and 14s having the receiving portion 18 may be disposed independently of each other on the edge sidewall of the pellicle membrane 20, at which the heat dissipation layers 24 are exposed, to surround the pellicle membrane 20.

When the first to fourth segments 11s, 12s, 13s and 14s of the cooling structure 10a are disposed independently of each other on the edge sidewall of the pellicle membrane 20 as described above, the cooling structure 10a may be disposed to be closer to the pellicle membrane 20 along a shape of the edge sidewall of the pellicle membrane 20.

In addition, when the pellicle membrane 20 is inserted in the inner space surrounded by the first to fourth segments 11s, 12s, 13s and 14s which have the receiving portion 18 replacing the pellicle frame 40, the components of the EUV pellicle structure 200a may be simplified and the number of the contact surfaces between the components may be reduced. Thus, the pellicle membrane 20 and the cooling structure 10a may be adhered more closely to each other to improve the contact efficiency between the cooling structure 10a and the pellicle membrane 20. As a result, the heat dissipation efficiency from the pellicle membrane 20 to the outside through the cooling structure 10a may be improved.

A single thin silicon layer may be typically formed using silicon having a high transmittance for EUV to manufacture a pellicle for EUV lithography, unlike the aforementioned embodiments of the inventive concepts. In this case, the single thin silicon layer may have the high transmittance for the EUV but may have weak mechanical strength by its thin thickness. Thus, the single thin silicon layer may be physically deformed and/or broken. On the contrary, if the thickness of the thin silicon layer is increased, the transmittance of the thin silicon layer for the EUV may be reduced.

In addition, if a support structure for supporting the thin silicon layer is added to a pellicle structure for EUV lithography to solve the above limitations, irradiated EUV may not be uniform by the support structure.

Furthermore, the pellicle thin layer may be damaged and/or deformed by a chemical reaction of hydrogen radicals used in a cleaning process.

However, according to the aforementioned embodiments of the inventive concepts, the method for manufacturing the EUV pellicle structure may include: preparing the pellicle membrane 20 that includes the intermediate layer structure 25 in which the EUV transmission layers 23 and the heat dissipation layers 24 are alternately stacked, the first thin layer 21 on the top surface of the intermediate layer structure 25, and the second thin layer 22 disposed on the bottom surface of the intermediate layer structure 25 and having the heat emissivity lower than that of the first thin layer 21; and disposing the cooling structure 10 or 10a for absorbing heat from the pellicle membrane 20 on the edge sidewall of the pellicle membrane 20 at which the heat dissipation layers 24 are exposed. In addition, the EUV pellicle structure manufactured by the method may be provided.

When the EUV transmission layer 23 including the material having the low extinction coefficient is used in the intermediate layer structure 25 of the pellicle membrane 20, the absorption rate of the EUV transmission layer 23 for the EUV may be low, and thus the EUV transmission layer 23 having an excellent transmittance may be formed even though the EUV transmission layer 23 has a relatively thick thickness. In addition, when the heat dissipation layer 24 including the material having the high thermal conductivity is used in the intermediate layer structure 25 of the pellicle membrane 20, the thermal stress concentrated at the EUV exposed portion of the pellicle membrane 20 may be reduced, and thus the pellicle membrane 20 with the improved thermal durability may be formed. As a result, it is possible to manufacture the pellicle membrane 20 which has the excellent transmittance for the EUV, the excellent mechanical strength, and the excellent thermal stability.

In addition, the first thin layer 21 including the material having the excellent radiation emission of heat and the excellent chemical resistance to hydrogen may be disposed on the top surface of the intermediate layer structure 25, and the second thin layer 22 including the material having the excellent toughness and the heat emissivity lower than that of the first thin layer 21 may be disposed on the bottom surface of the intermediate layer structure 25. Thus, it is possible to minimize thermal damage which may occur in the pellicle membrane 20 and the mask disposed under the second thin layer 22 by irradiation of the EUV in an exposure process, and it is possible to minimize chemical damage of the pellicle membrane 20 which may occur by a reaction with hydrogen radicals in a cleaning process.

Moreover, the protruding patterns may be formed on the outer surface of the cooling structure 10 or 10a including a material having a high emissivity, and thus the heat absorbed from the pellicle membrane 20 may be easily radiated and/or emitted through the cooling structure 10 or 10a.

Furthermore, according to an embodiment, the cooling structure 10 or 10a may include the receiving portion 18 replacing the pellicle frame 40 supporting the pellicle membrane 20. Thus, the process of adhering the pellicle membrane 20 onto the pellicle frame 40 may be omitted to reduce the process time and the process cost.

Furthermore, the cooling structure 10a may include the first to fourth segments 11s, 12s, 13s and 14s which include the receiving portion 18 and are divided from each other, and the first to fourth segments 11s, 12s, 13s and 14s may be adhered independently of each other to the pellicle membrane 20. In this case, the cooling structure 10a may be adhered more closely to the pellicle membrane 20 along the shape of the edge sidewall of the pellicle membrane 20, and thus the contact efficiency between the cooling structure 10a and the pellicle membrane 20 may be improved. As a result, the heat dissipation efficiency from the pellicle membrane 20 to the outside through the cooling structure 10a may be improved, and thus the EUV pellicle structure 200a with the improved thermal stability may be provided.

According to embodiments of the inventive concepts, it is possible to provide the EUV pellicle structure which has the high heat dissipation efficiency and the improved transmittance for the EUV. In addition, it is possible to provide the method for manufacturing the EUV pellicle structure, which is capable of reducing the process time and the process cost and of easily mass-producing the EUV pellicle structure.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing an extreme ultraviolet (EUV) pellicle structure, the method comprising:
    preparing a pellicle membrane that comprises: an intermediate layer structure in which EUV transmission layers and heat dissipation layers are alternately stacked; a first thin layer disposed on a top surface of the intermediate layer structure; and a second thin layer disposed on a bottom surface of the intermediate layer structure and having a heat emissivity lower than that of the first thin layer;
    preparing a pellicle frame; and
    disposing a cooling structure for absorbing heat from the pellicle membrane and the pellicle frame,
    wherein the cooling structure is in contact with an outer sidewall of the pellicle membrane at which the heat dissipation layers are exposed, and
    wherein the cooling structure is disposed on an outer sidewall of the pellicle frame.

2. The method of claim 1, wherein the cooling structure comprises: first and second portions facing each other in a first direction and extending in parallel to each other; and third and fourth portions facing each other in a second direction intersecting the first direction and extending in parallel to each other,
    wherein the first to fourth portions constitute a single unitary body,
    wherein the disposing of the cooling structure comprises: inserting the pellicle membrane into the cooling structure of the single unitary body.

3. The method of claim 2, wherein the cooling structure further comprises: a receiving portion protruding from the first to fourth portions toward an inner space surrounded by the first to fourth portions,
    wherein the disposing of the cooling structure comprises:
    disposing the pellicle membrane on the receiving portion of the cooling structure in such a way that the second thin layer is adjacent to the receiving portion, thereby inserting the pellicle membrane into the cooling structure.

4. The method of claim 1, wherein the cooling structure comprises: first and second segments facing each other in a first direction and extending in parallel to each other; and third and fourth segments facing each other in a second direction intersecting the first direction and extending in parallel to each other,
    wherein the disposing of the cooling structure comprises:
    adhering the first to fourth segments to the pellicle membrane independently of each other.

5. The method of claim 4, wherein the cooling structure further comprises: a receiving portion protruding from the first to fourth segments toward an inner space surrounded by the first to fourth segments,
    wherein the disposing of the cooling structure comprises:
    disposing the pellicle membrane on the receiving portion of the cooling structure in such a way that the second thin layer is adjacent to the receiving portion, thereby inserting the pellicle membrane comprising the first and second thin layers into the cooling structure.

6. The method of claim 1, wherein the heat dissipation layers transfer heat absorbed from the EUV transmission layers to the cooling structure, and
    wherein the cooling structure emits heat absorbed from the EUV transmission layers and the heat dissipation layers to the outside.

7. The method of claim 1, wherein the first thin layer radiates or emits heat absorbed from the EUV transmission layer to the outside.

8. The method of claim 1, wherein the cooling structure covers outer surfaces of the pellicle frame, the first thin layer and the second thin layer.

9. An extreme ultraviolet (EUV) pellicle structure comprising:
    a pellicle membrane comprising
        an intermediate layer structure in which EUV transmission layers and heat dissipation layers are alternately stacked; and
        a first thin layer adhered to a top surface of the intermediate layer structure; and
        a second thin layer adhered to a bottom surface of the intermediate layer structure and having a heat emissivity lower than that of the first thin layer,
    a pellicle frame supporting the pellicle membrane, and
    a cooling structure absorbing heat from the pellicle membrane and the pellicle frame, and surrounding the pellicle membrane and the pellicle frame,
    wherein the cooling structure is configured to absorb heat from the pellicle membrane and the pellicle frame,
    wherein the cooling structure is in contact with an outer sidewall of the pellicle membrane at which the heat dissipation layers are exposed, and
    wherein the cooling structure is disposed on an outer sidewall of the pellicle frame.

10. The EUV pellicle structure of claim 9, wherein the cooling structure includes: an inner surface being in direct contact with the heat dissipation layers of the pellicle membrane to receive heat from the heat dissipation layers; and an outer surface for emitting heat to the outside.

11. The EUV pellicle structure of claim 9, wherein an outer surface of the cooling structure has a protruding pattern shape.

12. The EUV pellicle structure of claim 9, wherein the cooling structure further comprises a receiving portion protruding toward an inner space of the cooling structure, in which the pellicle membrane is disposed, and
    wherein the pellicle membrane is disposed on the receiving portion in such a way that the second thin layer is adjacent to the receiving portion.

* * * * *